(12) United States Patent
Cichocki

(10) Patent No.: US 8,372,763 B2
(45) Date of Patent: Feb. 12, 2013

(54) PROCESS FOR WET PASSIVATION OF BOND PADS FOR PROTECTION AGAINST SUBSEQUENT TMAH-BASED PROCESSING

(75) Inventor: Mattia Cichocki, Rome (IT)

(73) Assignee: Aptina Imaging Corporation, George Town (KY)

( * ) Notice: Subject to any disclaimer, the term of this patent is extended or adjusted under 35 U.S.C. 154(b) by 0 days.

(21) Appl. No.: 13/471,151

(22) Filed: May 14, 2012

(65) Prior Publication Data

US 2012/0225567 A1 Sep. 6, 2012

Related U.S. Application Data

(62) Division of application No. 12/390,012, filed on Feb. 20, 2009, now Pat. No. 8,198,731.

(30) Foreign Application Priority Data

Nov. 13, 2008 (IT) .............................. RM2008A0610

(51) Int. Cl.
 H01L 21/31 (2006.01)
 H01L 21/469 (2006.01)
(52) U.S. Cl. ........................ 438/786; 349/43; 349/116
(58) Field of Classification Search .................. 438/786; 257/765, E21.24, E23.017; 349/43, 116
 See application file for complete search history.

(56) References Cited

U.S. PATENT DOCUMENTS

| | | | |
|---|---|---|---|
| 6,190,040 B1 | 2/2001 | Renken | |
| 6,214,717 B1 | 4/2001 | Lan | |
| 6,582,983 B1 | 6/2003 | Runyon | |
| 6,610,419 B1 * | 8/2003 | Stamm | 428/632 |
| 6,989,608 B2 | 1/2006 | Rochette | |
| 7,294,524 B2 | 11/2007 | Park | |
| 7,871,756 B2 | 1/2011 | Takahashi | |
| 2001/0023127 A1 | 9/2001 | Andreas | |
| 2003/0030942 A1 | 2/2003 | Hipwell | |
| 2003/0197816 A1 | 10/2003 | Winer | |
| 2005/0101043 A1 | 5/2005 | Chen | |
| 2006/0113674 A1 | 6/2006 | Toyoda | |
| 2006/0141654 A1 * | 6/2006 | Lim | 438/48 |
| 2007/0037314 A1 | 2/2007 | Park | |
| 2007/0102842 A1 | 5/2007 | Naniwa | |
| 2008/0169267 A1 | 7/2008 | Uchida | |

FOREIGN PATENT DOCUMENTS

KR 20030026664 4/2003

OTHER PUBLICATIONS

Italian Search Report for IT RM20080610, Sep. 3, 2009.
Written Opinion for IT RM2008A000610, Nov. 13 , 2008.
Fujitsuka, et al. "Silicon Anisotropic Etching Without Attacking Aluminum with Si and Oxidizing Agent Dissolved in TMAH Solution" Sensors and Actuators A. vol. 114, No. 2-3, pp. 510-515 (2004).
Charavel, et al. "Advantages of $p^{++}$ Polysilicon Etch Stop Layer Versus $p^{++}$ Silicon" Proceedings of the SPIE—The International Society for Optical Engineering, vol. 5116, pp. 566-709 (2003).

* cited by examiner

Primary Examiner — Phuc Dang

(57) ABSTRACT

A process for forming a protective layer at a surface of an aluminum bond pad. The aluminum bond pad is exposed to a solution containing silicon, ammonium persulfate and tetramethylammonium hydroxide, which results in the formation of the protective layer. This protective layer protects the bond pad surface from corrosion during processing of an imager, such as during formation of a color filter array or a micro-lens array.

20 Claims, 8 Drawing Sheets

PROCESS FOR WET PASSIVATION OF BOND PADS FOR PROTECTION AGAINST SUBSEQUENT TMAH-BASED PROCESSING

This application is a division of U.S. patent application Ser. No. 12/390,012, filed Feb. 20, 2009 U.S. Pat. No. 8,198,731, which claims priority under 35 U.S.C. 119 to Italian patent application No. RM2008A000610, filed Nov. 13, 2008, which are hereby incorporated by reference in their entireties.

FIELD OF THE INVENTION

Disclosed embodiments relate generally to semiconductor circuits, and more particularly to a process for forming a protective layer on the surface of aluminum bond pads that protects the surface of the bond pads during subsequent processing.

BACKGROUND OF THE INVENTION

In semiconductor circuits and devices, bond pads are used to make electrical contact between various components of the circuit or device. For simplicity of discussion, the following discussion focuses on bond pads for imagers; however, the scope of the invention should not be limited as such and may be used for any type of integrated circuit device.

Imagers, including charge coupled devices (CCDs), photodiode arrays, charge injection devices (CIDs), hybrid focal plane arrays, and complementary metal oxide semiconductor (CMOS) imagers, have commonly been used in photo-imaging applications. Current applications of solid-state imagers include cameras, scanners, machine vision systems, vehicle navigation systems, star trackers, and motion detector systems, among others.

A CMOS imager typically includes a focal plane array of pixel cells, each one of the cells including a photosensor, for example, a photogate, photoconductor or a photodiode for accumulating photo-generated charge. Each pixel cell has a charge storage region, which is connected to the gate of an output transistor that is part of a readout circuit. The charge storage region may be constructed as a floating diffusion region. In some imagers, each pixel cell may include at least one electronic device such as a transistor for transferring charge from the photosensor to the storage region and one device, also typically a transistor, for resetting the storage region to a predetermined charge level prior to charge transference.

To allow the photosensors to capture a color image, the photosensors must be able to separately detect color components of the captured image. Accordingly, each pixel must be sensitive only to one color or spectral band. For this, a color filter array (CFA) is typically placed in front of the optical path to the photosensors so that each photosensor detects the light of the color of its associated filter.

Further, since the magnitude of the signal produced by each pixel is proportional to the amount of light impinging on the photosensor, it is also desirable to improve the photosensitivity of the imager by collecting light from a large light collecting area and focusing it onto a small photosensitive area of the photosensor. This can be done using a micro-lens array formed over the pixel array.

FIGS. 1A and 1B illustrate an imager 10 including a color filter array 30 and micro-lens array 35 over a pixel array 25. As can be seen in FIG. 1A, imaging portion 15 may be surrounded by peripheral circuitry 18 and bond pads 20. The bond pads 20 are electrically connected to device circuitry of the imager 10. Peripheral circuitry 18 controls the imaging portion 15 and converts electrical signals received from the imaging portion 15 into a digital image. As can be seen in FIG. 1B, the pixel array 25, peripheral circuitry 18 and bond pads 20 are formed in semiconductor wafer 50. Other conventional parts of the imager 10 are not shown or described herein.

The process for forming the color filter array 30 and/or micro-lens array 35 over the pixel array 25 requires a multi-step fabrication process. A common method of forming these structures includes a tetramethylammonium hydroxide (TMAH)-based developing solution. Typically, TMAH-based developing solutions used for color filter array formation have a TMAH concentration ranging from about 0.6% to about 2.6%. The entire CFA/microlens formation process typically involves about six developing steps where this developing solution comes into contact with the bond pad for approximately 30 seconds to 1 minute per each step. The TMAH contained in this developing solution is very aggressive on the aluminum from which the bond pads 20 are typically formed. As can be seen in FIG. 2, when an aluminum bond pad 20 is exposed to a TMAH-based developing solution 55, it is attacked and slowly etched away, creating pits 60 on the surface of the aluminum, making the surface very rough. Through an entire CFA/microlens formation process, about 100-200 nm of aluminum may be removed from the surface of an unprotected bondpad. This pitting and removal of aluminum can cause problems in later processing and use of the imager. The roughness, caused by the pitting, increases the scattering of light and makes the pads look very dark when viewing the pads through a scope. In addition, the excessive removal of aluminum can cause bonding issues, caused by too much topography in the aluminum layer or by not enough aluminum remaining in the bondpad.

An organic protective layer or an oxide layer can be formed over the bond pads 20 before the CFA/micro-lens formation process to protect the bond pads 20 from the TMAH solution. However, these layers must be removed after the CFA/micro-lens formation process in order to avoid problems (e.g., bonding issues during packaging of the imager) during later processing steps. Furthermore, the oxide layer, for example, must be removed using an expensive hard-coat process.

Accordingly, there is a need and desire for a simpler process by which bond pads may be protected during subsequent processing of a semiconductor device, for example, an imager.

DETAILED DESCRIPTION OF THE INVENTION

In the following detailed description, reference is made to the accompanying drawings which form a part hereof, and in which are shown by way of illustration specific embodiments that may be practiced. It should be understood that like reference numbers represent like elements throughout the drawings. These example embodiments are described in sufficient detail to enable those skilled in the art to practice them. It is to be understood that other embodiments may be utilized, and that structural, material, and electrical changes may be made, only some of which are discussed in detail below.

Disclosed embodiments relate to a process performed on an imager before formation of the color filter array and/or micro-lens array, though, as noted, the process can be used with bond pads of other semiconductor devices and circuits.

The disclosed process is able to effectively protect the aluminum bond pads from unwanted damage typically caused by a TMAH-based developing process used in the CFA/micro-lens formation process. Before formation of the CFA or micro-lens array, a wet process is performed that creates a very thin layer of an aluminum-silicon-oxygen ($Al_xSi_xO_x$) compound on the surface of the bond pad. The presence of the silicon in this thin layer of $Al_xSi_xO_x$ at the surface of the bond pad makes the aluminum from which the bond pad is formed resistant to the TMAH.

Figure 3:
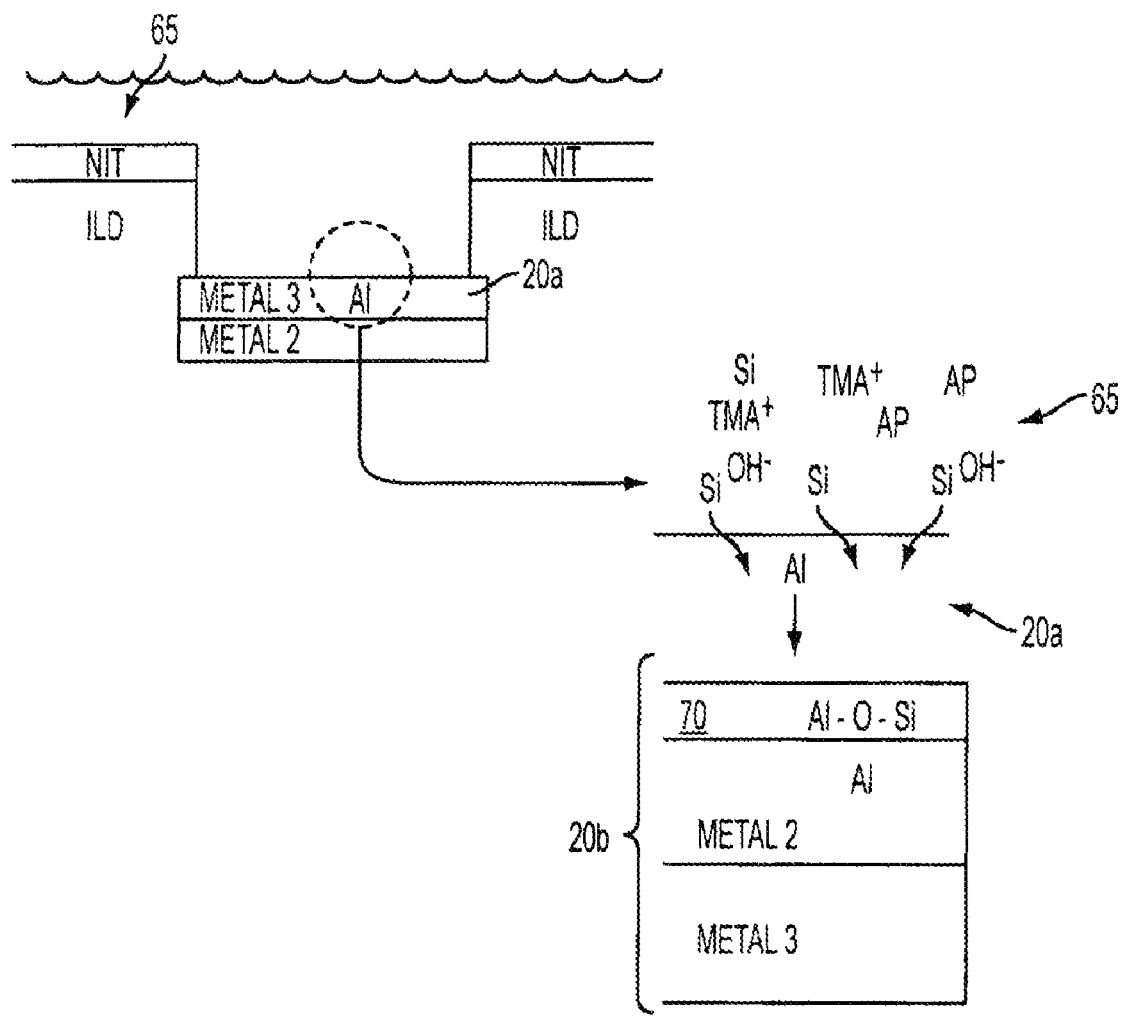
FIG. 3 illustrates a process for forming a protective Al—Si—O layer on bond pads, in accordance with disclosed embodiments.

FIG. 3 illustrates the wet process by which the Al—Si—O compound is formed on the surface of a bond pad 20a. The bond pad 20a is exposed in a wet process to a solution 65 comprising deionized water, silicon (Si), ammonium persulfate (AP) and TMAH (TMA$^+$ and OH$^-$) and having a pH of 12 +/−0.1. During exposure to the solution 65, silicon and oxygen are incorporated into the surface of the aluminum bond pad 20a, thereby forming a thin layer of an $Al_xSi_xO_x$ compound 70 and resulting in a protected bond pad 20b. The solution 65 comprises between about 3.0% and about 3.4% silicon, between about 2.2% and about 2.8% ammonium persulfate and between about 6.5% and about 8.5% TMA$^+$ ions. The bond pad 20a is exposed to the solution 65, followed by a DI water rinse and a Marangoni rinse, which dries the wafer.

While the exact mechanism of reaction for the formation of the protective layer is not known, it is thought that the solution has an ionic interaction with the aluminum on the surface of the bond pad. Some aluminum atoms are brought into the solution and substituted with the silicon atoms, thereby forming a more resistant bond on the surface of the bond pad. This interaction stops when the surface has been uniformly implanted with the maximum amount silicon with respect to the temperature and pH at which it is being processed.

In one embodiment, the process solution 65 comprises deionized water containing about 3.2% silicon, about 2.5% ammonium persulfate and about 7.5% TMA$^+$ and has a pH of 12 +/−0.1. The bond pad 20a is exposed to the solution 65 for about 6 minutes, maintaining the temperature at about 90° C., followed by a DI water rinse at about 40° C. and a Marangoni rinse, which dries the wafer. It may also be possible to expose the bond pad to the process solution 65 at temperatures as low as about 60° C. The variation in temperature results in a variation in concentration of silicon in the protective layer.

The thin layer of Al—Si—O compound 70 may have a thickness of up to about 3.5 nm. Preferably the thickness is about 2 nm. This thickness is sufficient to protect the bond pad 20b from attack by TMAH solution used in subsequent processing, such as during formation of a CFA and/or micro-lens array, but thin enough to allow uninhibited wire bonding at later processing steps (without needing to remove the protective layer).

The $Al_xSi_xO_x$ compound 70 formed at an upper portion of the bond pad 20b contains between about 4% and about 18% silicon, between about 40% and about 60% oxygen and between about 5% and about 30% aluminum. The balance of the is small amounts of other elements, such as carbon, nitrogen, fluorine and sulfur present in the bond pad 20a before processing. In one embodiment, the $Al_xSi_xO_x$ compound 70 formed at an upper portion of the bond pad 20b contains about 15% silicon, about 50% oxygen and about 20% aluminum.

Figure 4:
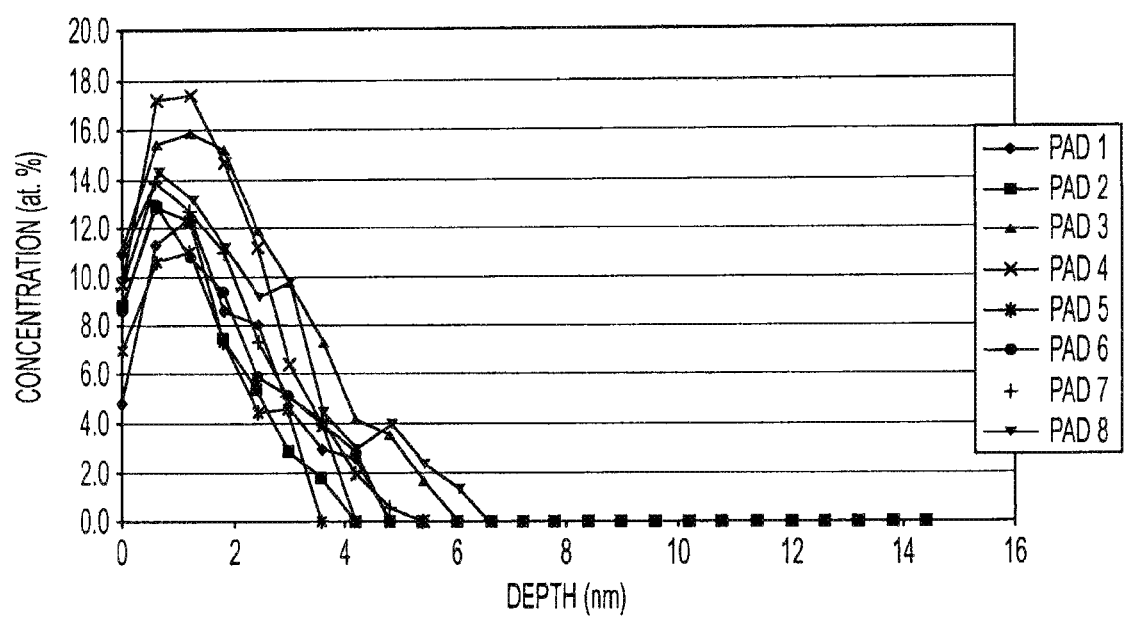
FIG. 4 illustrates experimental results of the silicon depth profile of eight bond pads processed with the disclosed process.
Figure 5:
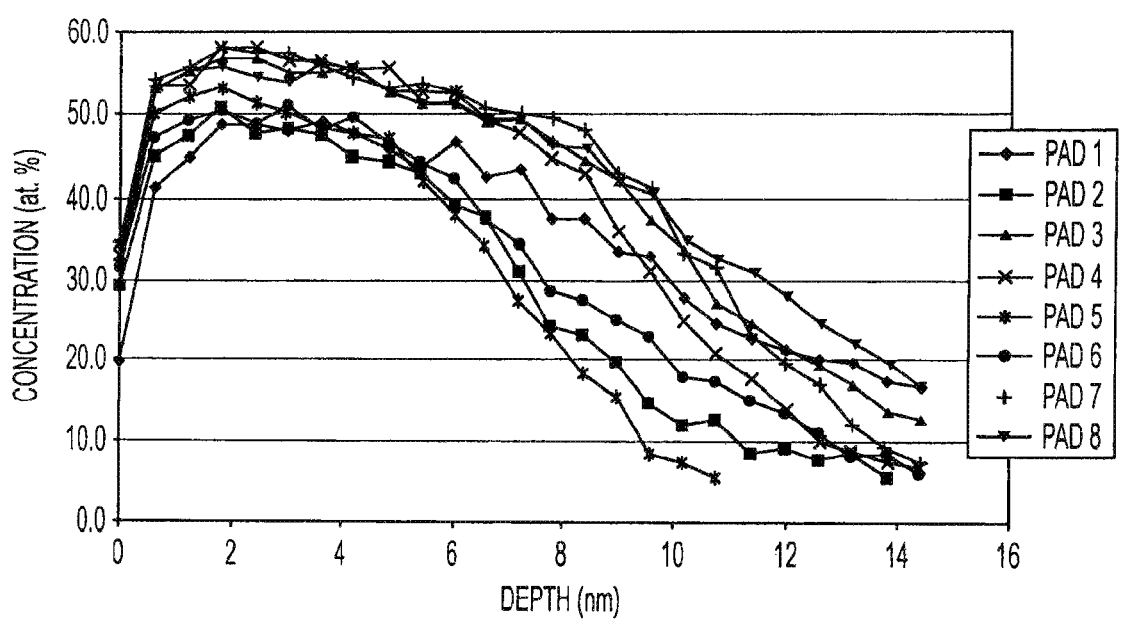
FIG. 5 illustrates experimental results of the oxygen depth profile of eight bond pads processed with the disclosed process.
Figure 6:
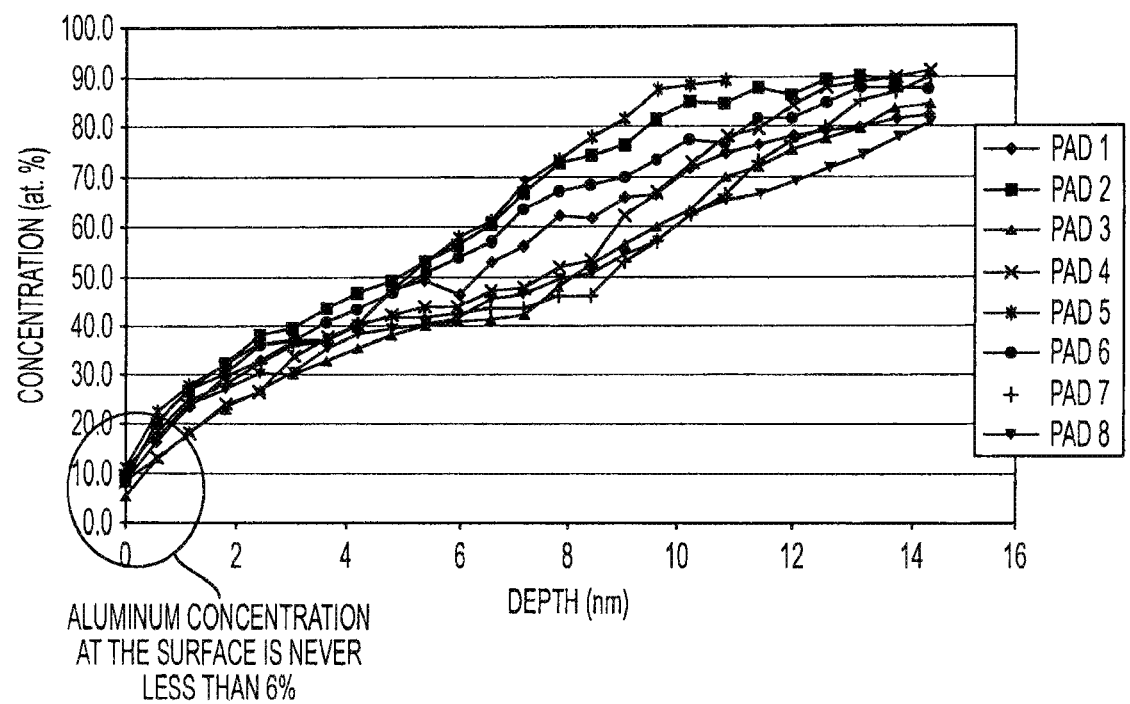
FIG. 6 illustrates experimental results of the aluminum depth profile of eight bond pads processed with the disclosed process.

FIG. 4 illustrates experimental results of the silicon depth profile of eight bond pads processed with the disclosed process. FIG. 5 illustrates experimental results of the oxygen depth profile of eight bond pads processed with the disclosed process. FIG. 6 illustrates experimental results of the aluminum depth profile of eight bond pads processed with the disclosed process. FIGS. 4-6 illustrate the concentration of silicon, oxygen and aluminum, respectively, at increasing depths below the surface of the bond pad. These charts show the extent of incorporation of silicon and oxygen into the surface of the aluminum bond pads by using the claimed process. These depth profiles were created based on an X-ray Photoelectron Spectroscopy (XPS) analysis of the bondpad surfaces.

Figure 1A:
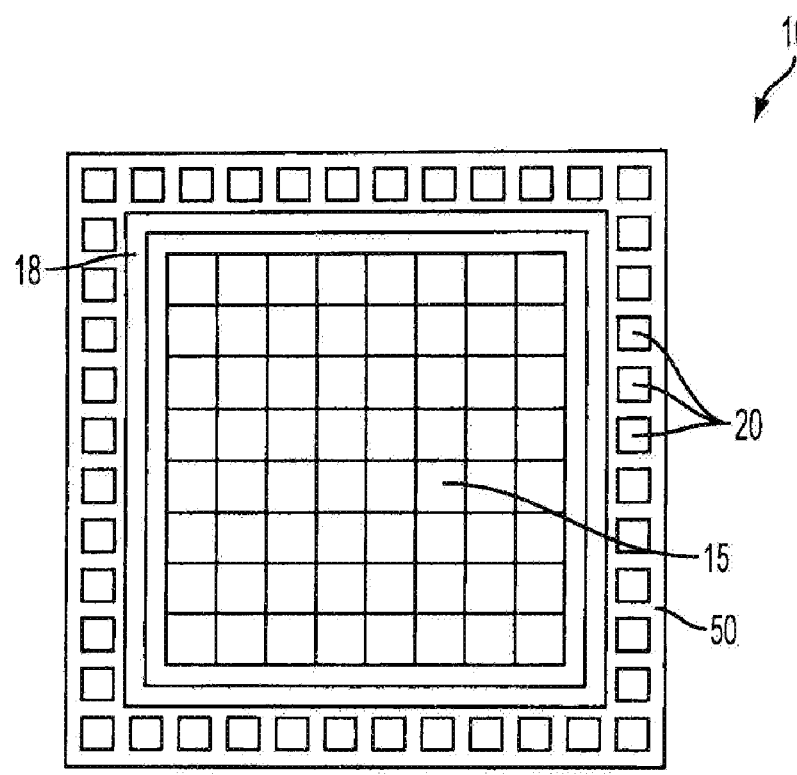
FIG. 1A is a schematic version of a top view of a conventional imager.
Figure 1B:
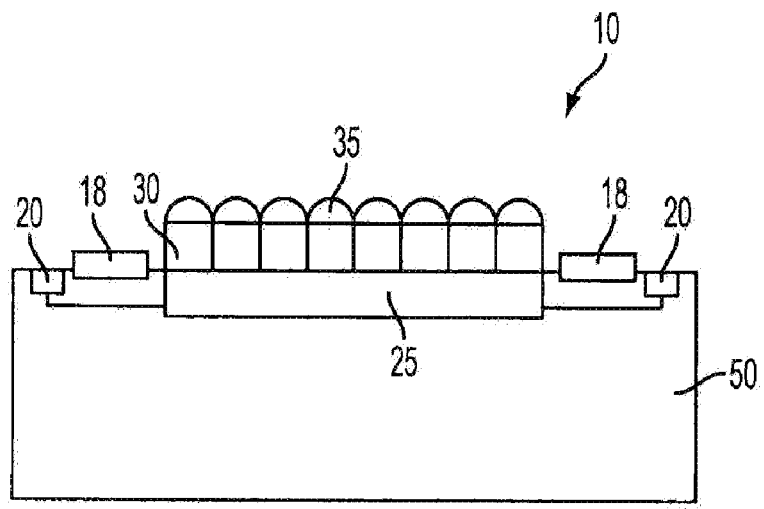
FIG. 1B is a schematic cross-sectional side view of the imager of FIG. 1A.
Figure 2:
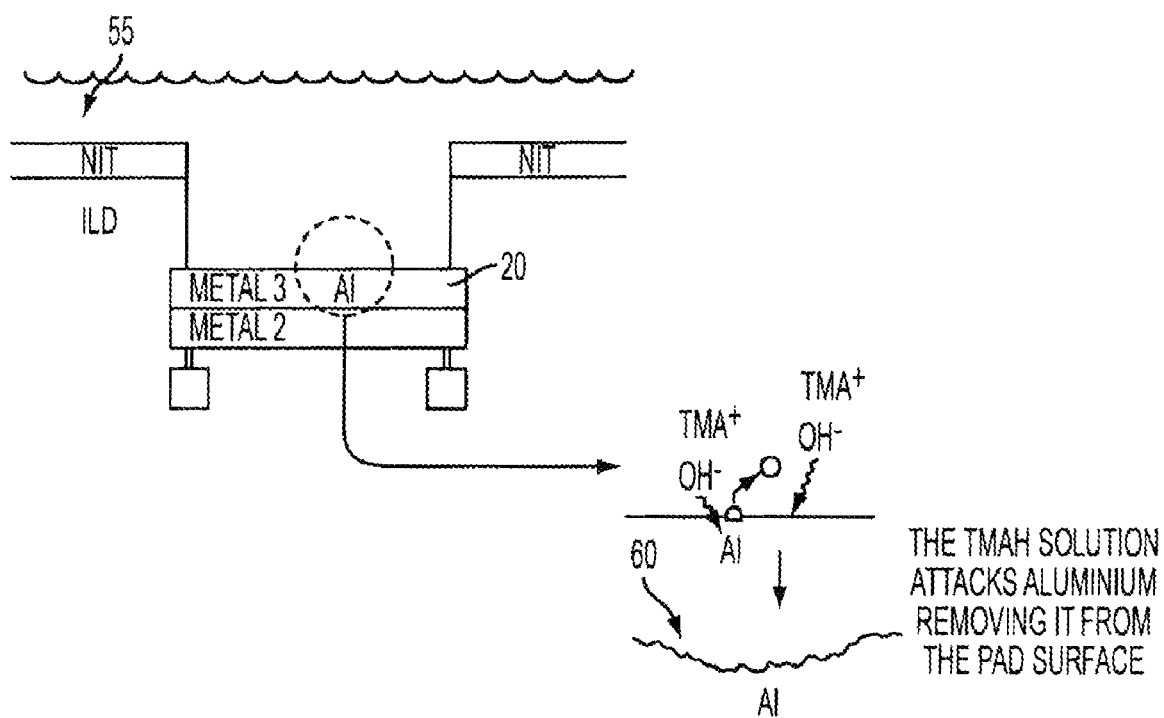
FIG. 2 illustrates the effect of a TMAH-based developing solution on an unprotected aluminum bond pad.
Figure 7:
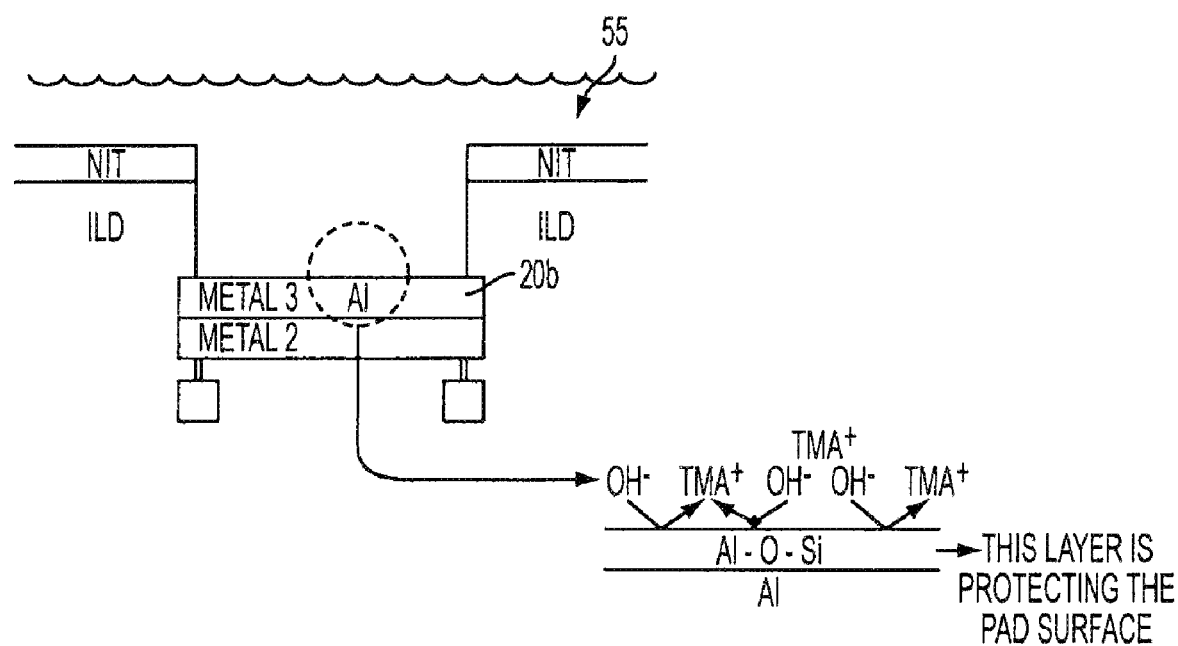
FIG. 7 illustrates the effect of a TMAH-based developing solution on a protected aluminum bond pad, in accordance with disclosed embodiments.

After the disclosed process is performed, the wafers can be subjected to subsequent processing, such as CFA/micro-lens formation using a standard, known process, without corrosion or pitting occurring on the bond pads. Additionally, the protective layer does not need to be removed prior to the subsequent processing. As can be seen in FIG. 7, when the protected aluminum bond pad 20b is exposed to a TMAH-based developing solution 55, aluminum is not removed from the surface of the pad 20b. Therefore, the problems associated with the pitting seen in FIG. 2 are avoided.

Figure 8:
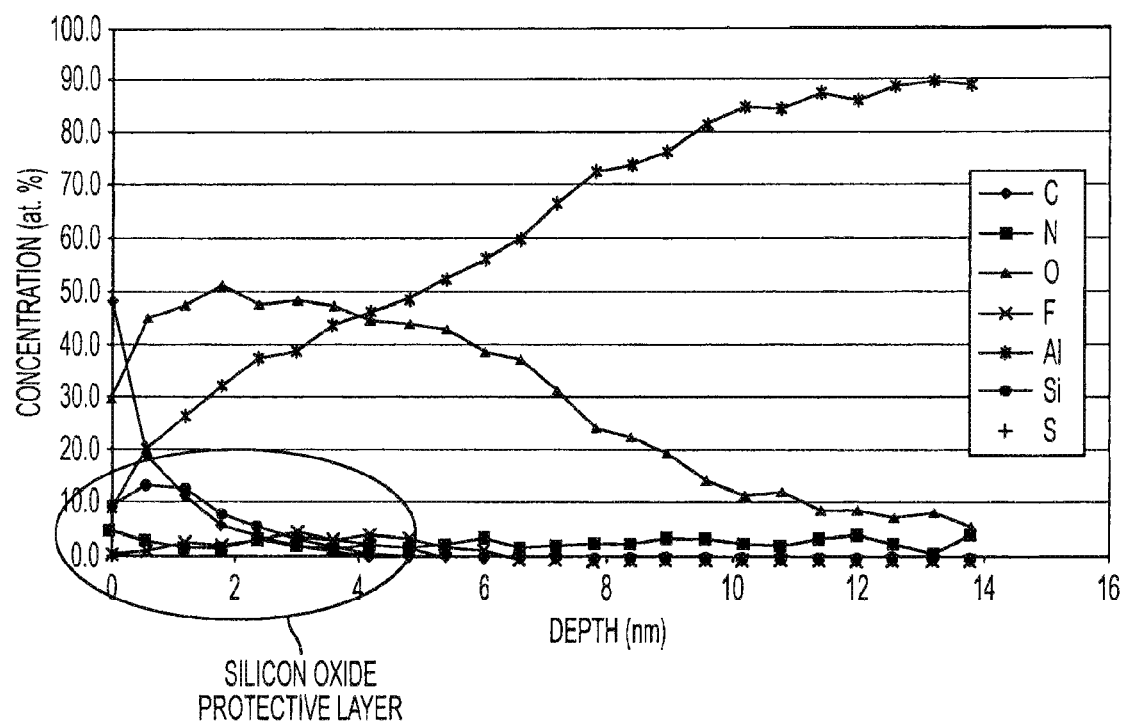
FIG. 8 illustrates an element composition depth profile of an aluminum bond pad processed in accordance with the disclosed process and through a color filter array process.

FIG. 8 illustrates a typical element composition depth profile of an aluminum bond pad processed with the wet solution in accordance with disclosed embodiments and then through a color filter array formation process. Again, these depth profiles were created based on an XPS analysis of the bondpad surfaces. FIG. 8 demonstrates that the protective layer (circled region on FIG. 8) is able to resist the rework process performed in the CFA process to allow reprocessing of the wafers. This means that this layer can easily stand multiple CFA/micro-lens processes without the necessity to reapply it.

While disclosed embodiments have been described in detail, it should be readily understood that the claimed invention is not limited to the disclosed embodiments or to use with imagers. Rather the disclosed embodiments can be modified to incorporate any number of variations, alterations, substitutions or equivalent arrangements not heretofore described.

What is claimed is:

1. A method of protecting an aluminum bond pad from subsequent processing steps, comprising:
    forming a protective layer on the aluminum bond pad by exposing the aluminum bond pad to a solution having silicon and tetramethylammonium hydroxide; and
    exposing the aluminum bond pad to a developing solution having tetramethylammonium hydroxide during a subsequent processing step, wherein the protective layer protects the aluminum bond pad from the developing solution.

2. The method defined in claim 1, wherein forming the protective layer on the aluminum bond pad comprises forming a protective layer comprising aluminum, silicon, and oxygen on the aluminum bond pad.

3. The method defined in claim 1, wherein the aluminum bond pad is located on an imager having a pixel array and wherein exposing the aluminum bond pad to the developing solution having tetramethylammonium hydroxide during the subsequent processing step comprises exposing the aluminum bond pad to the developing solution having tetramethylammonium hydroxide during formation of a color filter array over the pixel array.

4. The method defined in claim 1, wherein the aluminum bond pad is located on an imager having a pixel array and wherein exposing the aluminum bond pad to the developing solution having tetramethylammonium hydroxide during the subsequent processing step comprises exposing the aluminum bond pad to the developing solution having tetramethylammonium hydroxide during formation of a micro-lens array over the pixel array.

5. The method defined in claim 1, wherein the aluminum bond pad is located on an imager having a pixel array and wherein exposing the aluminum bond pad to the developing solution having tetramethylammonium hydroxide during the subsequent processing step comprises exposing the aluminum bond pad to the developing solution having tetramethylammonium hydroxide during one of a reworking of a microlens array over the pixel array and a reworking of a color filter array over the pixel array.

6. The method defined in claim 1, further comprising wire-bonding a wire to the aluminum bond pad without removing the protective layer, wherein the protective layer has a thickness of up to about 3.5 nm.

7. The method defined in claim 1, further comprising wire-bonding a wire to the aluminum bond pad without removing the protective layer, wherein the protective layer has a thickness of about 2 nm.

8. A method of protecting an aluminum bond pad from subsequent processing steps, comprising:
    forming a protective layer on the aluminum bond pad by exposing the aluminum bond pad to a solution having silicon and tetramethylammonium hydroxide, wherein the protective layer comprises aluminum, silicon, and oxygen.

9. The method defined in claim 8, further comprising:
    exposing the aluminum bond pad to a developing solution during a plurality of subsequent processing steps, wherein the protective layer protects the aluminum bond pad from the developing solution, wherein the plurality of subsequent processing steps include a plurality of reworking steps of one of a color filter array and a micro-lens array.

10. The method defined in claim 8, further comprising:
    exposing the aluminum bond pad to a developing solution having tetramethylammonium hydroxide during a plurality of subsequent processing steps, wherein the protective layer protects the aluminum bond pad from the developing solution.

11. The method defined in claim 8, wherein forming the protective layer on the aluminum bond pad by exposing the aluminum bond pad to the solution having silicon and tetramethylammonium hydroxide comprises forming the protective layer on the aluminum bond pad by exposing the aluminum bond pad to a solution having silicon and tetramethylammonium hydroxide, and having a pH of 12+/−0.1.

12. The method defined in claim 8, wherein forming the protective layer on the aluminum bond pad by exposing the aluminum bond pad to the solution having silicon and tetramethylammonium hydroxide comprises forming the protective layer on the aluminum bond pad by exposing the aluminum bond pad to a solution having between about 6.5% and about 8.5% tetramethylammonium ions.

13. The method defined in claim 8, wherein forming the protective layer on the aluminum bond pad by exposing the aluminum bond pad to the solution having silicon and tetramethylammonium hydroxide comprises forming the protective layer on the aluminum bond pad by exposing the aluminum bond pad to a solution having between about 3.0% and about 3.4% silicon.

14. The method defined in claim 8, wherein forming the protective layer on the aluminum bond pad by exposing the aluminum bond pad to the solution having silicon and tetramethylammonium hydroxide comprises forming the protective layer on the aluminum bond pad by exposing the aluminum bond pad to a solution having about 3.2% silicon and about 7.5% tetramethylammonium ions.

15. A method of protecting an aluminum bond pad from subsequent processing steps, comprising:
    forming a protective layer on the aluminum bond pad by a wet process, wherein the protective layer is formed from aluminum, silicon, and oxygen and wherein the aluminum in the protective layer is incorporated from the aluminum bond pad.

16. The method defined in claim 15, further comprising:
    exposing the aluminum bond pad to a developing solution having tetramethylammonium hydroxide during a subsequent processing step, wherein the protective layer protects the aluminum bond pad from the developing solution.

17. The method defined in claim 15, wherein forming the protective layer on the aluminum bond pad by the wet process comprises forming the protective layer on the aluminum bond pad by exposing the aluminum bond pad to a solution having tetramethylammonium hydroxide, wherein the protective layer comprises between about 4% and about 18% silicon, between about 40% and about 60% oxygen and between about 5% and about 30% aluminum, and wherein the solution also includes ammonium persulfate .

18. The method defined in claim 15, wherein forming the protective layer on the aluminum bond pad by the wet process comprises forming the protective layer on the aluminum bond pad by exposing the aluminum bond pad to a solution having tetramethylammonium hydroxide at a temperature between about 60° C. and about 90° C.

19. The method defined in claim 15, further comprising:
    exposing the aluminum bond pad to a developing solution having tetramethylammonium hydroxide during a subsequent processing step, wherein the protective layer protects the aluminum bond pad from the developing solution; and
    wire-bonding a wire to the aluminum bond pad without removing the protective layer.

20. The method defined in claim 15, wherein the aluminum bond pad is located on an imager having a pixel array, the method further comprising:
    exposing the aluminum bond pad to a developing solution having tetramethylammonium hydroxide during a formation of one of a color filter array and a micro-lens array, wherein the protective layer protects the aluminum bond pad from the developing solution; and
    wire-bonding a wire to the aluminum bond pad without removing the protective layer.

* * * * *